United States Patent [19]

Jagota et al.

[11] Patent Number: 4,806,198

[45] Date of Patent: Feb. 21, 1989

[54] PRODUCING ALPHA-ALUMINA WHISKERS

[75] Inventors: Sujata Jagota; Rishi Raj, both of Ithaca, N.Y.

[73] Assignee: Cornell Research Foundation, Inc., Ithaca, N.Y.

[21] Appl. No.: 115,928

[22] Filed: Nov. 2, 1987

[51] Int. Cl.$^4$ ............................................. C30B 5/00
[52] U.S. Cl. ...................... 156/623 R; 156/DIG. 61; 156/DIG. 112; 23/295 G; 423/625; 501/95
[58] Field of Search ............. 156/DIG. 61, DIG. 112, 156/603, 623 R, 621; 23/295 G, 301; 423/625, 626; 501/95, 127; 427/180, 192, 190, 372.2, 376.2; 51/309, 293

[56] References Cited

U.S. PATENT DOCUMENTS

| | | | |
|---|---|---|---|
| H 000,189 | 1/1987 | Bauer | 423/626 |
| 2,915,475 | 12/1959 | Bugosh | 252/313.2 |
| 3,031,418 | 4/1962 | Bugosh | 423/625 |
| 3,094,385 | 6/1963 | Brisbin | 423/630 |
| 3,311,689 | 3/1967 | Kelsey | 423/626 |
| 3,607,067 | 9/1971 | Nicki | 156/613 |
| 3,615,258 | 10/1971 | Glass | 156/601 |
| 3,650,703 | 3/1972 | Labelle et al. | 156/608 |
| 3,998,686 | 12/1976 | Meiling et al. | 156/617 R |
| 4,193,768 | 3/1980 | Ohishi et al. | 423/625 |
| 4,248,852 | 2/1981 | Wakabayashi et al. | 423/626 |
| 4,416,723 | 11/1983 | Pelts et al. | 156/608 |
| 4,500,504 | 2/1985 | Yamamoto | 423/345 |
| 4,562,059 | 12/1985 | Asaoka et al. | 423/626 |
| 4,615,875 | 10/1986 | Gonczy et al. | 423/626 |

OTHER PUBLICATIONS

Hawley, G. G. "The Condensed Chemical Dictionary", 8 Ed., 1971, p. 774.
McCabe et. al., "Unit Operations of Chemical Engineering", 3rd Ed., 1976, pp. 772-782.
Jagota, S., et al, Journal of Crystal Growth 85 (1987) 527-534.
Doremus, R. H., et al, *Growth & Perfection of Crystals*, pp. 63-67 (Wiley, New York, 1958).
Klein, L. C., "Oxide Coatings from the Sol-Gel Process," Ceramic Eng. Sci. Proc., vol. 5, pp. 379-384, 1984.
Kumagai, M., et al, Communications of the American Ceramic Society, Nov. 1984, pp. C-230, C-231.
Kumagai, M., et al, J. Amer. Ceramic. Soc., 68 [9], 500-505 (1985).
Pierre, A. C., et al, "Gelation of Aluminum Hydroxide Sols," J. Am. Cer. Soc 70 [1], 28-32, 1987.
Pierre, A. C., et al, "Super-Amorphous Alumina Gels," Material Research Soc. Symp. Proc. 32, pp. 119-124 (1984).
Yoldas, B. E., "Alumina Gels That Form Transparent Al$_2$O$_3$," J. Material Science 10, pp. 1856-1860, 1975.
Yoldas, B. E., "Alumina Sol Preparation Form Alkoxides," Ceramic Bulletin 54, No. 3, 289-290, 1975.

*Primary Examiner*—John Doll
*Assistant Examiner*—R. Bruce Breneman

[57] ABSTRACT

Alpha-alumina whiskers are produced by forming a film of boehmite gel seeded with alpha-alumina seed material, preferably sapphire, and heating at 900° C. to 1200° C. for 5 minutes to 2 hours.

15 Claims, No Drawings

PRODUCING ALPHA-ALUMINA WHISKERS

TECHNICAL FIELD

This invention was made in part with Government support under National Science Foundation grant NSF-DMR-86-16616. The Government has certain rights in the invention.

This invention relates to a method of producing alpha-alumina whiskers The term "whisker" is used herein to mean filamentary single crystals with aspect ratios (length to diameter ratios) of greater than 5:1.

BACKGROUND OF THE INVENTION

Composite material, e.g. where the matrix material is ceramic (such as, for example, silicon nitride, zirconia, alumina, ailicate glasses, magnesia-aluminate spinel) or metal, is advantageously reinforced with ceramic fibers where high strength and stiffness is required.

Polycrystal alumina fibers are not suitable for use in composite materials because they weaken at high temperatures and thus disintegrate during forming, e.g. in hot pressing or hot isostatic pressing.

Alpha-alumina whiskers, which are single crystals, retain their strength at high temperature and thus, unlike polycrystal alumina fibers, are suitable for forming processes and high temperature usage, and therefore are suitable for use in composite materials.

However, alpha-alumina whiskers have not come into commercial usage for reinforcing composites because known processes for their production have disadvantages. In Particular, it is known to form alpha-alumina whiskers from vapor phase reactions and from growth from a melt. Brisbin et al U.S. Pat. No. 3,094,385 and Glass U.S. Pat. No. 3,615,258 teach vapor phase reactions. The Brisbin method requires control over gas flow and control over level of supersaturation (as small changes in supersaturation level can change morphology), and the Glass method requires electrostatic treatment. Labelle et al U.S. Pat. No. 3,650,703 discloses growth from a melt and has the disadvantage therefore of requiring very high temperatures (a temperature slightly above the melting point which is the vicinity of 2000° C. is recited in column 6).

So far there has been no teaching of producing alpha-alumina whiskers from seeded or unseeded alumina gels.

It has been found herein that alpha-alumina whiskers can be grown from seeded alumina gel in a process which is much simpler than the known vapor phase and melt growth processes.

SUMMARY OF THE INVENTION

It has been found herein that alpha-alumina whiskers are readily produced simply by heat treating a seeded film of boehmite gel.

In particular the process herein comprises the steps of (a) providing a film of boehmite gel seeded with alpha-alumina seed material, (b) heating the seeded gel at a temperature in the range of 900° C. to about 1200° C. for a time period ranging from about 5 minutes to about 2 hours to cause said alpha-alumina seed material to seed growth therefrom in said boehmite gel of alpha-alumina whiskers.

The whiskers produced are of single crystal alpha-alumina, have aspect ratios greater than 5:1 and ordinarily can have lengths from about 1 micron to about 5 mm and widths (transverse dimension or diameter) of about 0.01 to about 10.0 microns and do not lose strength in hot pressing or hot isostatic pressing in the formation of composites and are suitable for use in composites for high temperature usage.

DETAILED DESCRIPTION

The boehmite gels herein are alumina gels which are converted to alpha-alumina in the heat treatment step herein; i.e. in step (b) described above. These boehmite gels comprise hydrated aluminum oxide dispersed in water. The boehmite gels are used herein in the form of films which ordinarily have a thickness ranging from about 0.1 micron to about 1 mm.

These gels are readily prepared, for example, by known methods by forming an alumina sol from aluminum alkoxide and then concentrating. For example these gels are readily prepared by controlled hydrolysis of aluminum-tri-sec-butoxide (which is commercially available) and then drying to a water content of 30-50% by weight to form a gel as described by Klein, L. C., "Oxide coatings from the sol-gel process", Ceramic Eng. Sci. Proc., Vol. 5, pp. 379–384, 1984. Preparation of these gels is also described in Yoldas, B. E., "Alumina gels that form transparent $Al_2O_3$", J. of Material Science 10, pp. 1856–1860, 1975. See also Pierre, A. C., et al, "Super-amorphous Alumina Gels", Material Research Soc. Symp. Proc. 32, pp. 119–124 (1984); Pierre, A. C., et al, "Gelation of Aluminum Hydroxide Sols", J. Am. Cer. Soc. 70 [1] 28–32, 1987; Yoldas, B. E., "Alumina Sol Preparation from Alkoxides", Ceramic Bulletin 54. No. 3, 289–290, 1975. The term "sol" is used herein to mean a colloidal dispersion in water which is readily pourable. The term "gel" is used herein to mean a viscous colloidal dispersion which is not readily pourable. The drying of the sol to form a gel is readily carried out, for example, by evaporation at room temperature or in an oven at temperatures up to about 60° C. or by freeze drying, e.g. utilizing a conventional freeze drier with liquid nitrogen and the application of vacuum. Moreover, centrifuging can be utilized to remove some water from a sol in converting it to a gel.

Preferably, the sol is deposited as a thin film on a substrate which can be alpha-alumina single crystal seed material and drying is carried out on the film to convert it to a film of boehmite gel. Sufficient drying of such thin film by evaporation at ambient ordinarily requires 3 to 5 days, and sufficient drying of such thin film in an oven at 60° C. is obtained in about 12 hours (e.g. overnight). On drying a thin film of sol in an oven, temperatures over about 60° C. have been found to cause cracking in the film of gel which is formed and therefore are much less preferred.

The alpha-alumina seed material used herein can be single crystal or polycrystalline and can be, for example, sapphire or alpha-alumina powder.

The sapphire material can be natural or synthetic sapphire. A preferred material is commercially available synthetic sapphire with orientation with the c-axis in the plane of the crystal. While orientation with the c-axis in the plane of the crystal is preferred since growth is preferred in this direction, sapphire with other orientation is readily used. The sapphire for use herein normally has a thickness ranging about 0.1 mm to about 5 mm but preferably for purposes of economy and convenience of handling has a thickness ranging from about 2 mm to about 3 mm. The sapphire material used herein preferably has at least one substantially planar surface.

The alpha-alumina powder which is useful as seed material herein ordinarily consists of particles with a substantially spherical configuration with diameters ranging from about 0.1 microns up to 100 microns.

In one embodiment herein, step (a), i.e. the step of providing a film of boehmite gel seeded with alpha-alumina seed material, is carried out by depositing a film of boehmite gel on substantially planar sapphire surface. This is readily carried out by depositing a film of alumina sol prepared as described above on said sapphire surface and then drying as described above. The depositing is readily carried out, for example, by dip-coating (i.e. dipping the sapphire in the sol), spin coating (e.g. utilizing a commercial spin coater) or centrifuging sol onto sapphire substrate.

In one particular application of this embodiment, step (a) is carried out by dipping sapphire into a body of alumina sol, removing the sapphire from said body with film of sol thereon, and drying to convert said sol to boehmite gel to cause film of boehmite gel to form on said sapphire.

In another particular application of this embodiment, step (a) is carried out by centrifuging sapphire with alumina sol, removing the sapphire with film of sol thereon to a freeze drier and freeze drying to form a film of boehmite gel on said sapphire.

In still another embodiment of the invention herein, step (a) is carried out by forming a body of alumina sol (prepared as described above) in a container with sapphire therein and drying, preferably in an oven at a temperature up to 60° C., to cause said body of sol to form a film of boehmite gel on said sapphire. In this embodiment the amount of sol in said body of sol is selected to provide a film of gel of appropriate thickness without any excess.

In still another embodiment of the invention herein, step (a) comprises contrifuging a suspension of particles of alpha alumina seed material having diameters ranging from about 0.1 microns to about 100 microns and alumina sol (prepared as described above) and then freeze drying to form a film of boehmite gel with said alpha alumina seed particles dispersed therein. The seed material is, for example, the alpha-alumin powder described above. The suspension of particles of alpha-alumina seed material is readily prepared by dispersing said powder in water, e.g. at a weight percentage of 0.01 to 2 weight percent, adjusting the pH to range, for example, from 2 to 3, using, for example, nitric acid, and ultrasonicating to disperse the particles of said powder in suspension. In this embodiment, it is preferred to use a substrate to support the film of gel which is very desirably grid or screen material of heat resistant construction (e.g. of tungsten) which is centrifuged with the sol and suspension of particles of alpha alumina seed material and then removed to a freeze dryer to form a film of boehmite gel seeded with alpha-alumina particles on said substrate, and the substrate and seeded film are removed to heat treatment as described in step (b) above. In a variation of this embodiment a substrate of grid material is coated with gel film and seeds are spun onto the film in a centrifuge.

In still another embodiment of the invention herein which is a continuous process, in step (a) the alumina sol prepared as described above is continuously applied to provide a film of sol on a moving belt and seed material is continuously distributed in said film of sol and the belt with seeded film of sol thereon is passed through a drier to form a seeded film of boehmite gel on the belt. The belt is then moved continuously through a heat treating furnace in step (b) herein.

We turn now to step (b) herein, i.e. the step of heating the seeded gel at a temerature in the range of 900° C. to about 1200° C. for a time period ranging from about 5 minutes to about 2 hours to cause the alpha-alumina seed material to seed growth therefrom in said boehmite gel of alpha-alumina whiskers.

At temperatures below 900° C. the gel is not transformed to alpha-alumina and no morphological change is seen compared to unheated gel. At 900° C. very fine whiskers are produced but only part of the gel is transformed to alpha-alumina. At temperatures higher than 200° C. and times longer than 2 hours, formed whiskers sinter together into dense thick aggregates which are less useful for reinforcing purposes than where the whiskers do not sinter together which is the case on use of temperatures of 1200° C. and below and heat treatment times of 2 hours and less. Heat treatment times of at least 5 minutes are required before any significant whisker growth occurs. The most useful heat treatment temperature range is from 1000° C. to 1200° C. with the period for this ranging from 10 minutes to 1 hour.

In the case where sapphire pieces with gel thereon are treated in step (b), this is readily carried out by transferring said pieces to a platinum crucible and heating in air in a tube furnace with an alumina tube and molybdenum disilicide elements or in nitrogen in a Centorr furnace with tungsten mesh elements.

In the case where gel and alpha-alumina particles are deposited by centrifuging or other means on grid structure, the grid structure with seeded gel thereon is readily treated in step (b) by heating in an argon or nitrogen atmosphere in said Centorr furnace. The inert atmosphere prohibits the grid structure from being oxidized.

In the continuous process described above, the belt with seeded gel thereon is readily treated in step (b) by passing it through a furnace to provide the specified heat treating time period and temperature.

In carrying out step (b), increasing the heat treatment temperature has been found to cause increase in width of the whiskers produced.

Step (b) is ordinarily carried out under a pressure ranging from 1 to 10,000 atmospheres and a relative humidity greater than 5%.

Carrying out step (b) in high pressure, high humidity environments, can lead to greater whisker yields.

In step (b), the whiskers grow by consuming gel and remain physically attached to the seed material. About $10^6$ to $10^9$ whiskers are normally produced per square inch of surface of seed material.

The whiskers formed herein often have an aspect ratio rangIng from 10.1 to 10,000:1 and often have lengths ranging up to about 0.1 mm. The whisker length has been found to be a function of distance between seeds in step (a).

There is no need to recover individual whiskers and to separate such from the seed material. In other words, the seed material with attached whiskers can be used for reinforcing purposes. If desired, the whiskers can be separated from seed material, e.g. by microtoming the upper thin layer of sapphire to which grown whiskers are pendent. In the case where substrate is used which is not also seed material, product is readily recovered simply by separating the substrate and product, e.g. by picking up product from the grid material or by flexing the belt substrate to loosen the product therefrom and then using it to convey the product to a recovery container.

The product is readily used by dispersing it into matrix material, for example, by admixing it with ceramic powder and hot-pressing on hot-isostatic pressing, or where the matrix material is metal, dispersing the product in the molten metal.

The following examples are illustrative of the invention.

The sapphire pieces used in the examples were commercially obtained synthetic sapphire with the c-axis in the plane of the crystal.

EXAMPLE I 700 ml of deionized water was heated to 80° C. 90 g of Al-tri-sec-butoxide (obtained commercially) was added to this with constant stirring. 5 ml of 70% nitric acid was added to the mixture, and it was stirred and heated simultaneously to maintain the 80° C. temperature. The contents were initially milky white but turned clear and almost transparent after about an hour. The mixture was now a peptized alumina sol. After the volume had reduced to about half the initial volume, 100 ml of sec-butanol was added (the sec-butanol was to keep the colloidal particles well separated so as to minimize aggregation and precipitation) to produce sol which forms boehmite gel on drying.

A film of gel was deposited on pieces of sapphire crystal (each 2-3 mm thick) by (i) dipping 0.5 inch long by 0.5 inch wide sapphire piece in said product sol using a tweezers, removing sapphire piece with sol thereon and drying overnight in an oven at 60° C. and (ii) placing sapphire piece 0.5 inch long by 0.2 inch wide on the bottom of a beaker containing 100 ml of said product sol and heating at 60° C. in an oven for two days until the sol gelled and hardened. A patchy film of boehmite gel (having a thickness ranging from 0.1 mm to 1 mm) was deposited on sapphire piece in each case.

The sapphire pieces with gel thereon were placed in a platinum crucible and heat treated in a Centorr furnace at 1200° C. for 20-30 minutes after a heat up period of about 5 minutes. Whiskers grew on sapphire surface on each sapphire piece and were identified to be alpha-alumina by electron and x-ray diffraction. The morphology was confirmed using scanning and transmission electron microscopy. The whiskers had lengths ranging from 10 microns to 0.1 mm.

EXAMPLE II

Sol for forming boehmite gel on drying was prepared as in Example I. 10 microliters of the sol was placed in the cell of an ultracentrifuge along with 10 microliters of a 1 wt % suspension of 0.2 micron diameter alpha-alumina seed particles. The suspension was prepared by admixing 0.2 micron diameter alpha-alumina powder (purchased commercially) with water and adjusting the pH to 2.5 by nitric acid addition and treating the admixture ultrasonically to disperse the particles in suspension. Also placed in the ultracentrifuge were tungsten transmission electron microscopy grids (TEM grids), each 3 mm diameter. The ultracentrifuge was spun at 90,000 rpm for 5 minutes so that the seeds and sol deposited on the grids as seeded films. The grids with seeded sol thereon were removed from the ultracentrifuge and placed in a freeze drier where application of vacuum and liquid nitrogen converted the sol to gel. The grids with seeded gel (0.1 micron thick film) thereon were heat treated in a tube furnace in an argon atmosphere (to prevent oxidation of the grids) respectively at 700° C., 900° C., 1000° C., 1120° C. and 1200° C. for 20 minutes. The gel was found to grow into whiskers at 900° C. and above. Alpha-alumina whiskers were obtained with widths as indicated in Table 1. In each case the widths set forth are average values based on 50-100 measurements.

TABLE 1

| T °C. | Whisker width (nm) |
|---|---|
| 900 | 21.5 |
| 1000 | 21.5 |
| 1100 | 38.5 |
| 1200 | 59.0 |

Whisker lengths ranged from 1 micron to 10 microns.

EXAMPLE III

Sol for forming boehmite gel on drying was prepared as in Example I. A sapphire piece 0.2 inches long by 0.2 inches wide by 2-3 mm thick was placed in an ultracentrifuge with 50 microliters of the sol, and centrifuging was carried out to deposit a film of sol on the sapphire piece. The piece of sapphire was then removed to a freeze drier where the sol was converted to a gel. The sapphire piece with seeded gel thereon (0.5-1 micron thick film) was heat treated in a tube furnace as in Example I. Whisker lengths ranged from 1 micron to 20 microns and average whisker width was about the same as obtained for 1200° C. in Example II.

Other variations will be evident to those skilled in the art. Therefore, the scope of the invention is intended to be defined by the claims.

What is claimed is:

1. Process for producing alpha-alumina whiskers, said process comprising the steps of
   (a) providing a film of boehmite gel seeded with alpha-alumina seed material,
   (b) heating the seeded gel at a temperature in the range of 900° C. to about 1200° C. for a time period ranging from about 5 minutes to about 2 hours to cause said alpha-alumina seed material to seed growth therefrom in said boehmite gel of alpha-alumina whiskers.

2. Process as recited in claim 1 wherein said alpha-alumina seed material is sapphire having substantially planar surface and step (a) is carried out by depositing a film of boehmite gel on said substantially planar surface.

3. Process as recited in claim 2 wherein the film of gel has a thickness ranging from about 0.1 micron to about 1 mm and the sapphire has a thickness ranging from about 0.1 mm to about 5 mm.

4. Process as recited in claim 3 wherein the sapphire has a thickness ranging from about 2 mm to about 3 mm.

5. Process as recited in claim 4 wherein step (a) is carried out by dipping said sapphire into a body of alumina sol, removing the sapphire from said body with film of sol thereon, and drying to cause said film of sol to form film of boehmite gel on said sapphire.

6. Process as recited in claim 4 wherein step (a) is carried out by forming a body of aluminasol in a container with said sapphire therein and drying to cause said body of sol to form a film of boehmite gel on said sapphire.

7. Process as recited in claim 4 wherein step (a) is carried out by centrifuging said sapphire with alumina sol and then freeze drying.

8. Process as recited in claim 1 wherein step (a) comprises centrifuging a suspension of particles of alpha-alumina seed material having diameters ranging from about 0.1 microns to about 100 microns and alumina sol and then freeze drying to form a film of boehmite gel with said alpha-alumina particles dispersed therein.

9. Process as recited in claim 1 wherein in step (b) said temperature ranges from about 1000° C. to about 1200° C. and heating at such temperature is carried out for a time period ranging from about 10 minutes to about 1 hour.

10. Process as recited in claim 1 wherein the whiskers formed have lengths ranging from about 1 micron to about 5 mm and diameters ranging from 0.01 microns to 10.0 microns.

11. Process as recited in claim 10 wherein the whiskers formed have lengths ranging from about 1 micron to about 0.1 mm.

12. The process of claim 1 wherein in step (a) the film of gel has a thickness ranging from about 0.1 micron to about 1 mm.

13. The process of claim 12 wherein step (a) is carried out by depositing a film of boehmite gel on a substantially planar surface of alpha-alumina seed material.

14. The process of claim 12 wherein step (a) comprises forming a film of boehmite gel with alpha-alumina particles dispersed therein.

15. A process for producing ceramic oxide whiskers, said process comprising the steps of
   (a) producing a film of ceramic oxide gel seeded with single crystal seed material of the same ceramic oxide as the ceramic oxide of the gel;
   (b) heating the seeded gel at a temperature and for a time period to cause said single crystal ceramic oxide seed material to seed growth therefrom in said gel of whiskers of said ceramic oxide thereby to transform at least part of said gel to whiskers but not so as to cause sintering of formed whiskers into aggregates.

* * * * *